United States Patent
Numasawa et al.

(10) Patent No.: US 7,091,138 B2
(45) Date of Patent: Aug. 15, 2006

(54) FORMING METHOD AND A FORMING APPARATUS OF NANOCRYSTALLINE SILICON STRUCTURE

(75) Inventors: Yoichiro Numasawa, Fuchu (JP); Nobuyoshi Koshida, 12-8, Midoricho 3-chome, Koganei-shi, Tokyo (JP) 84-0003

(73) Assignees: Anelva Corporation, Fuchu (JP); Nobuyoshi Koshida, Koganei (JP)

( * ) Notice: Subject to any disclaimer, the term of this patent is extended or adjusted under 35 U.S.C. 154(b) by 0 days.

(21) Appl. No.: 10/927,159

(22) Filed: Aug. 27, 2004

(65) Prior Publication Data

US 2005/0048796 A1 Mar. 3, 2005

(30) Foreign Application Priority Data

Aug. 29, 2003 (JP) ............................. 2003-307592

(51) Int. Cl.
*H01L 21/31* (2006.01)
(52) U.S. Cl. ...................... 438/778; 438/779; 438/762; 427/588
(58) Field of Classification Search ...................... None
See application file for complete search history.

(56) References Cited

U.S. PATENT DOCUMENTS 6,706,336 B1 * 3/2004 Kondo et al. ............... 427/588

FOREIGN PATENT DOCUMENTS

| JP | 2000-273450 | 10/2000 |
|----|-------------|---------|
| JP | 2003-086093 | 3/2003  |

* cited by examiner

*Primary Examiner*—Dung A. Le
(74) *Attorney, Agent, or Firm*—Buchanan Ingersoll PC

(57) ABSTRACT

A forming method and a forming apparatus of nanocrystalline silicon structure makes it possible to prepare a nanocrystalline silicon structure at a low temperature to have densely packed silicon crystal grains which are stably terminated and to effectively control the grain size in nanometer scale. A forming method and a forming apparatus of nanocrystalline silicon structure with oxide or nitride termination, carry out a first step of treating a surface of a substrate with hydrogen radical; a second step of depositing silicon crystals having a grain size of 10 nm or less by the thermal reaction of a silicon-containing gas; and a third step of terminating the surface of the silicon crystal with oxygen or nitrogen by using one of oxygen gas, oxygen radical and nitrogen radical.

8 Claims, 3 Drawing Sheets

US 7,091,138 B2

FORMING METHOD AND A FORMING APPARATUS OF NANOCRYSTALLINE SILICON STRUCTURE

CROSS-REFERENCE TO RELATED APPLICATIONS

The present application claims the priority of JP 2003-307592, filed in Japan on Aug. 29, 2003, the entire contents of which are incorporated herein by reference.

BACKGROUND OF THE INVENTION

1. Field of the Invention

The present invention relates to a forming method and a forming apparatus of nanocrystalline silicon structure with oxide or nitride termination, and more particularly to a forming method and forming apparatus of nanocrystalline silicon structure carried out by using dry processes only.

2. Description of Related Art

A nanocrystalline silicon structure with oxide or nitride termination is composed of a large number of silicon single crystals which have a grain size of 10 nm or less and are terminated with oxygen or nitrogen. Since the nanocrystalline silicon structure shows unique physical phenomena as to electron confinement, photoluminescence and electron emission, it has been noticed for its possibility of application to a variety of devices such as a single electron memory LSI, an optical interconnection LSI, a light emitting device and a lightweight, large screen display panel.

The nanocrystalline silicon structure has been mainly prepared by two methods. In the process of forming silicon single crystal grains, one method employs an anodic oxidation treatment, and the other method employs an annealing treatment of, for example, an amorphous silicon nitride film having stoichiometrically excessive silicon to precipitate silicon single crystal grains.

In the former method, as described in JP2003-86093A, a polycrystalline silicon film is deposited on a substrate by using CVD method (Chemical Vapor Deposition), then annealed, and anodically oxidized in a hydrogen fluoride solution to form single crystal grains. That is, the polycrystalline silicon is partially etched in the anodic oxidation treatment to prepare the nanocrystalline silicon structure comprised of a large number of nanoscale silicon crystal grains. After the anodic oxidation, the surfaces of crystal grains are electrochemically treated, for example, in sulfuric acid to terminate crystal grains with oxygen. Thus, the nanocrystalline silicon structure with oxide termination is prepared. As mentioned above, since the polycrystalline silicon is partially etched to form crystal grains, the silicon structure thus prepared is porous and therefore referred to as a porous silicon.

In the latter method described in, for example, JP2000-273450A, an amorphous silicon nitride film is formed on a substrate by using CVD method. Here, the ratio of a material gas such as monosilane (SiH4) gas to ammonia (NH3) gas is adjusted so that the amorphous silicon nitride film has a stoichiometrically excessive amount of silicon atoms; i.e., x<4/3 in SiNx. Then, the film is annealed to precipitate nanoscale silicon crystal grains. Thus, the nanocrystalline silicon structure with nitride termination is prepared. When an SiOx film is formed instead of SiNx, the nanocrystalline silicon structure terminated with oxygen is similarly prepared.

SUMMARY

For the application of the nanocrystalline silicon structure to various devices, it is required that the size of crystal grains can be highly controlled at the nanometer level, and the nanoscale silicon crystal grains are packed with high density and stably terminated. In addition, the nanocrystalline silicon structure is preferably prepared by a low-temperature process (lower than 600° C.) so that a glass substrate can be used, and the preparation cost is desired to be low, which is an important condition for the forming method of nanocrystalline silicon structure. In the case of an LSI application, it is preferable that the forming method of nanocrystalline silicon structure is comprised of dry processes only.

The method described in JP2003-86093A is advantageous in size controllability and termination stability of nanoscale crystal grains, and in addition may be composed of low-temperature processes only. However, a wet process of the anodic oxidation is inevitable in this method. Furthermore, since the anodic oxidation is employed to etch silicon and prepare the structure, the packing density of the nanoscale silicon crystal grains is not sufficient.

On the other hand, the forming method described in JP2000-273450A is comprised of the dry process only. However, the packing density of nanoscale silicon crystal grains is very low even when compared to that prepared by using the anodic oxidation method. Moreover, in order to precipitate nanoscale silicon single crystal grains, the annealing process must be carried out at a high temperature around 1000° C., which makes it impossible to employ a glass substrate.

Under such circumstances, an object of this invention is to provide a forming method of nanocrystalline silicon structure which makes it possible to prepare a nanocrystalline silicon structure at a low temperature and using dry processes only (without using a wet process) to have densely packed silicon crystal grains which are stably terminated and to effectively control the grain size in nanometer scale.

Another object of this invention is to provide a forming apparatus of nanocrystalline silicon structure to carry out the forming method of this invention.

Thus, an embodiment of the forming method of nanocrystalline silicon structure with oxide or nitride termination of this invention comprises: treating a surface of a substrate with hydrogen radical; depositing silicon crystals having a grain size of 10 nm or less by the thermal reaction of a silicon-containing gas; and terminating the silicon crystals with oxygen or nitrogen by using at least one of oxygen gas, oxygen radical and nitrogen radical.

Through such three steps, it becomes possible to form uniform crystal grains with high density, as compared with the conventional method, and therefore to prepare a nanocrystalline silicon structure applicable to a variety of high function devices.

Furthermore, the forming method can be used such that the first step, the second step, and the third step are continuously repeated to prepare the nanocrystalline silicon structure with a predetermined thickness.

Here, the hydrogen radical is preferably generated by the plasma decomposition reaction of hydrogen gas (H2), and the oxygen radical and nitrogen radical are also preferably generated by the plasma decomposition reaction of oxygen (O2) gas, nitrous oxide (N2O) gas, or ammonia (NH3) gas. By means of the plasma decomposition reactions, high-density radicals of hydrogen, oxygen, nitrogen and the like can be stably generated, which improves the uniformity of substrate surface treatment and termination treatment, and increases the rate of these treatments. And the ammonia gas can displace hydrogen bonding to silicon atom to complete nitrogen termination.

As a silicon-containing gas, monosilane ($SiH_4$) gas, disilane ($Si_2H_6$) gas, and a mixed gas thereof with hydrogen ($H_2$) gas are preferably employed. These gases make it possible to reproducibly prepare the silicon structures with crystal grains having a uniform size under the temperature control of a substrate. The mixed gas with hydrogen ($H_2$) gas is preferably employed to terminate dangling bonds of silicons with hydrogen in the forming process of crystals and further improve the perfection of crystal structure.

Furthermore, the first step, the second step, and the third step are continuously carried out in one and the same vacuum chamber to improve the uniformity of crystal grain size and the termination stability. Consequently, the uniformity of device characteristics and the reproducibility are increased.

One embodiment of the forming apparatus of nanocrystalline silicon structure of this invention is constructed to carry out the above-mentioned forming methods and comprises a vacuum chamber in which a substrate susceptor is provided, an inductively coupled plasma generating mechanism and a heating mechanism to heat a substrate placed on the substrate susceptor, to continuously carry out the first step, the second step and the third step in the vacuum chamber.

By means of the forming method of nanocrystalline silicon structure of this invention which can excellently control the size of crystal grains in nanometer scale, the nanocrystalline silicon structures are reproducibly prepared to have densely packed and uniform crystal grains with a predetermined size and excellent termination stability. Consequently, it becomes possible to further improve the characteristics concerning various new physical phenomena such as electron confinement, photoluminescence, and electron emission and the like.

That is, the devices are remarkably upgraded by means of the nanocrystalline silicon structures with oxide or nitride termination prepared by the forming method of this invention. Furthermore, the nanocrystalline silicon structure can be prepared by the low-temperature processes at a temperature lower than 600° C. where a glass substrate is employed, and by the dry processes only. Therefore, a variety of devices including LSI can be manufactured by the forming method of this invention.

Figure 1:
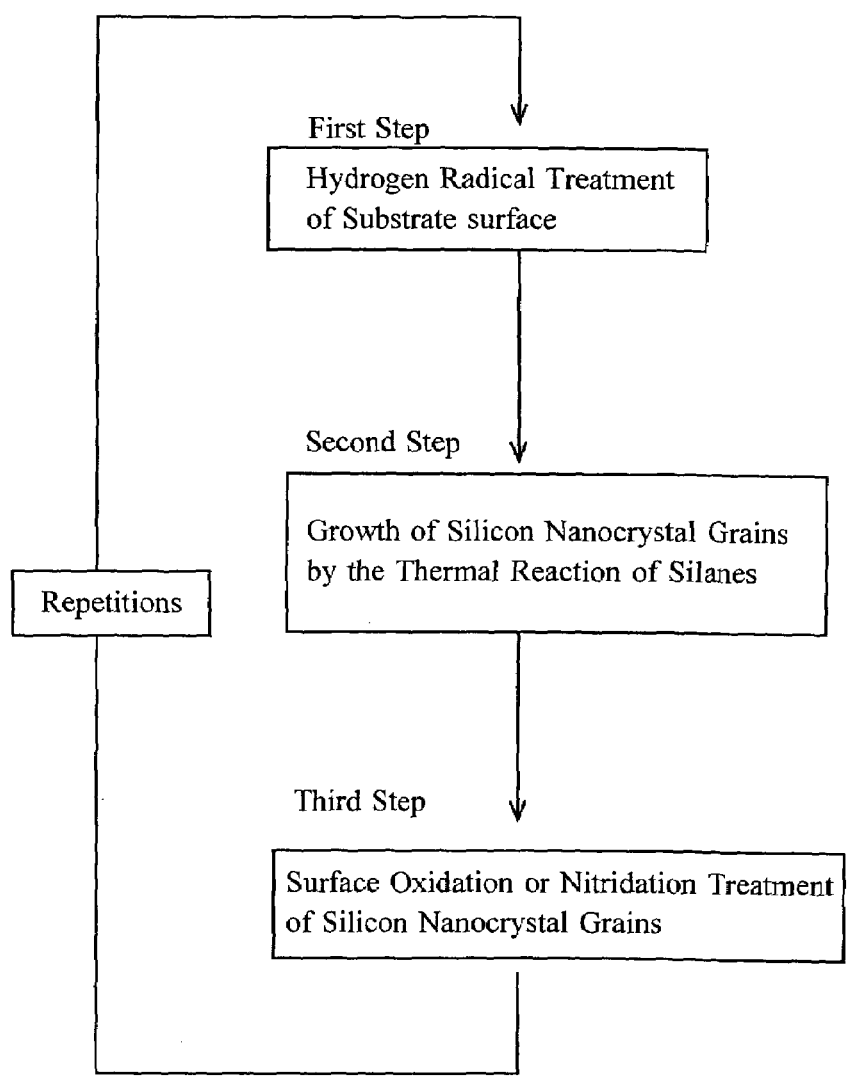
FIG. 1 is a flow chart explaining an embodiment of a forming method of nanocrystalline silicon structure of this invention.

Here, numeral 101 denotes a vacuum chamber; 102 is a plasma generating chamber; 103 is a lamp chamber; 104 is a lamp; 105 is a quartz window; 106; is a cylindrical insulator; 107 is a substrate susceptor; 108 is an inductive coupling coil; 109 is a matching box, 110 is a radiation thermometer; 111 is a gas inlet; 112 is a gas pipe; 113 is a gas switching unit; 114 is a hydrogen gas inlet; 115 is a silane gas inlet; 116 is an oxygen gas inlet; 117 is an inert gas inlet; 118 is a gate valve; 119 is a gas exhaust port; and 120 is a substrate.

DESCRIPTION OF PREFERRED EMBODIMENTS

An embodiment of this invention is explained by referring to the drawings.

FIG. 1 is a flow chart explaining an embodiment of the present invention. In a forming method of nanocrystalline silicon structure of this invention, as is shown in FIG. 1, according to a first step, a surface of a substrate is treated with hydrogen radicals; in a second step, silicon nanocrystal grains are deposited on the substrate by the thermal reaction of a silicon-containing gas; and in a third step in, the surfaces of the silicon nanocrystal grains are terminated with oxygen or nitrogen using an oxygen gas, an oxygen radical or a nitrogen radical. The three steps are repeated until the nanocrystalline silicon structure comes to a predetermined thickness.

That is, in the hydrogen radical treatment, the nucleation sites for silicon nanocrystal grain growth are formed over the whole surface of the substrate. For example, in the case of a silicon substrate, a natural oxide film is generally formed on the surface. Therefore, the substrate surface is covered with O—H groups after the hydrogen radical treatment. The O—H groups act as a nucleation site to prepare the nanocrystalline silicon structure with high packing density of crystal grains Then, the silicon-containing gas such as monosilane gas is introduced to grow crystal grains at respective nucleation sites. Here, the size of crystal grains can be reproducibly controlled by the temperature of substrate.

Oxygen radicals or nitrogen radicals are preferably used for the termination treatment of silicon crystal grains, and thereby the crystal grains can be terminated completely.

In this invention, various types of substrate can be employed, such as a quartz, a silicon nitride, and a glass substrate in addition to the silicon substrate. Furthermore, various silanes, especially monosilane ($SiH_4$) gas and disilane ($Si_2H_6$) gas, are preferably employed as a silicon-containing gas. As a source of oxygen radicals and nitrogen radicals, a variety of gases containing nitrogen or oxygen are employed. In particular, oxygen ($O_2$) gas, nitrous oxide ($N_2O$) gas, and ammonia ($NH_3$) gas are preferably employed.

Figure 2:
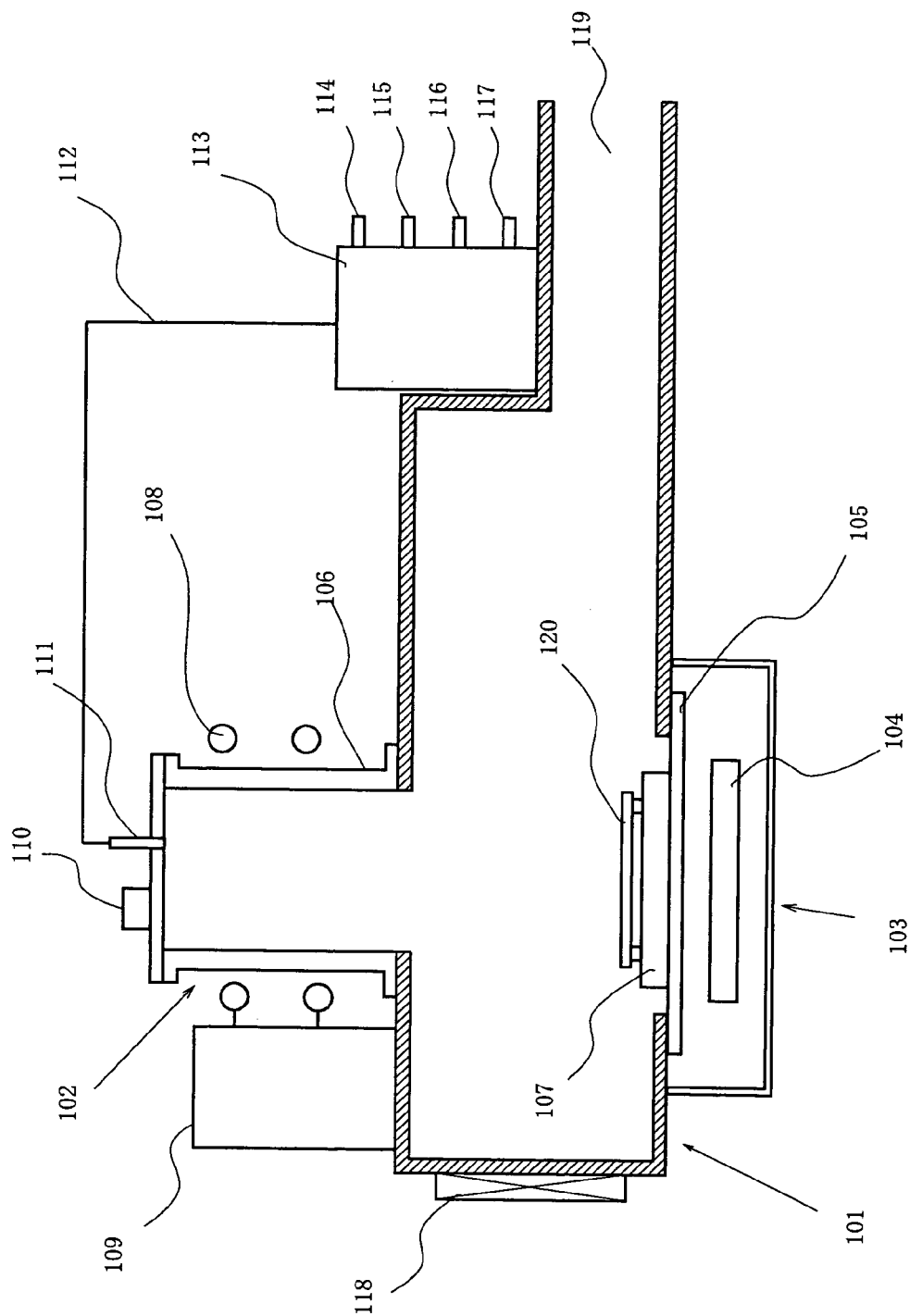
FIG. 2 is a schematic sectional view showing a forming apparatus of nanocrystalline silicon structure according to an embodiment of the present invention.

Next, there will be explained an embodiment of a forming apparatus of the nanocrystalline silicon structure which is preferably used for carrying out the forming method of this invention. FIG. 2 is a schematic sectional view showing one example of such a forming apparatus to prepare a nanocrystalline silicon structure on a substrate with a diameter of 8 inches.

As shown in FIG. 2, the apparatus of this embodiment is comprised of a vacuum chamber 101 in which a susceptor 107 made of quartz is installed to place a substrate 120 thereon, a plasma generating chamber 102, and a lamp chamber 103 in which a lamp 104 is installed to heat the substrate. The plasma generating chamber 102 is comprised of a cylindrical insulator (made of, for example, glass) 106 which has a gas inlet 111, and a two- or three-turn inductive coupling coil 108 attached around the cylindrical insulator in the atmosphere. The coil is connected to a high frequency power source of several MHz (not illustrated) through a matching box 109. Adoption of the inductively coupled plasma excitation method can easily generate plasma at a location distant from the substrate and transport only the radicals to the substrate surface out of species which are generated by the plasma decomposition reaction.

The gas inlet 111 is connected to a gas switching unit 113 through a gas pipe 112. A hydrogen gas inlet 114, a silane gas inlet 115, an oxygen gas inlet 116, and an inert gas inlet 117 of the unit are connected to respective gas sources. The process gases are introduced into the plasma generating chamber through the gas pipe 112 by operating the gas switching unit 113 according to a programmed sequence. The gas introduced into the plasma generating chamber 102 is exhausted by an exhaust apparatus such as a dry pump (not illustrated) through a gas exhaust port 119 of the vacuum chamber 101. The substrate 120 is transferred in and out through a gate valve 118.

A quartz window 105 is arranged between the vacuum chamber 101 and the lamp chamber 102, through an O-ring to keep the vacuum chamber airtight. The radiant heat from the lamp 104 passes through the quartz window 105 and the quartz susceptor 107 to heat the substrate to a predetermined temperature. Here, the substrate temperature is measured with the aid of a radiation thermometer 110 attached on the upper part of the plasma chamber 102, and is controlled to be at the predetermined temperature.

By the use of the lamp heating and the radiation thermometer, the components such as wiring are not required to be provided in the vacuum chamber. The inside configuration of the vacuum chamber becomes very simple and the components that disturb the gas flow can be removed. Thus, the exchange of hydrogen gas, silane gas, and oxygen gas can be made smoothly and quickly to improve the productivity.

The quartz window 105 and the cylindrical insulator 106 which constitute the apparatus are arranged so that both have a common central axis. Furthermore, the sectional area of the space inside the cylindrical insulator is made smaller and the area of the quartz window is made larger than the area of the substrate. Thereby, the symmetry of the heat radiation to the substrate can be secured for the uniformity of substrate temperature distribution. Furthermore, since the plasma treatment and the thermal CVD (chemical vapor deposition) can be carried out in the same vacuum chamber, three steps of the first step through the third step are carried out continuously. Thus, a high quality nanocrystalline silicon structure can be prepared at a lower cost.

Some experiments were made to prepare the nanocrystalline silicon structures using the forming apparatus shown in FIG. 2, which will be explained below. Here, a silicon wafer with a diameter of 8 inches and a thickness of 0.8 mm was used as the substrate 120.

The silicon substrate 120 which had been cleaned was transferred into the vacuum chamber 101 through the gate valve 118 and placed on the susceptor 107. Then, the production process was started according to the programmed sequence described below.

Step 1 (Lamp Heating)
Electric power was supplied to the lamp 104 and adjusted to keep the substrate at 540° C., responding to the signal from the radiation thermometer 110. It took about 20 seconds to raise and keep the substrate temperature at 540° C. after the lamp was turned on. In the following processes, the substrate temperature was maintained at 540° C.

Step 2 (Exhausting)
The valve (not illustrated) attached at the exhaust port 119 of the vacuum chamber 101 was opened to exhaust the vacuum chamber for 10 seconds (to a pressure of 40 Pa).

Step 3 (Hydrogen Radical Treatment)
The hydrogen gas was introduced at a flow rate of 100 ml/min for 10 seconds (at a pressure of 50 Pa). Then, the high frequency electric power of 1000 W was supplied to the inductive coupling coil 108 to generate hydrogen plasma. The surface of the silicon substrate 120 was treated with thus generated hydrogen radicals for 7 seconds.

Step 4 (Exhausting)
The supply of high frequency electric power and the introduction of hydrogen gas were stopped, and the vacuum chamber was exhausted for 8 seconds.

Step 5 (Growth of Silicon Nanocrystal Grains)
A monosilane gas was introduced for 3 seconds at a flow rate of 100 ml/min (at a pressure of 100 Pa). In 3 seconds after the monosilane gas was introduced, silicon crystal grains grew to a diameter of about 2 nm at the nucleation sites of the O—H group formed over the whole substrate surface.

Step 6 (Exhausting)
Introduction of monosilane gas was stopped, and the vacuum chamber was exhausted for 5 seconds.

Step 7 (Inert gas purge)
Argon gas as an inert gas was introduced for 5 seconds at a flow rate of 1000 ml/min.

Step 8 (Exhausting)
The introduction of argon gas (inert gas) was stopped, and the vacuum chamber was exhausted for 10 seconds.

Step 9 (Surface Oxidation Treatment of Silicon Nanocrystal Grains)
Oxygen gas was introduced at a flow rate of 100 ml/min to terminate the surface of silicon crystal grains with oxygen. In 5 seconds after oxygen gas was introduced, high frequency electric power of 500 W was supplied to the inductive coupling coil 108 to treat the surface of silicon crystal grains using oxygen radicals for 5 seconds. After the treatment, the introduction of oxygen gas was stopped and the vacuum chamber was exhausted.

By the treatments from Step 1 through Step 9, the first layer of silicon nanocrystalline structure terminated with oxygen was formed. Then, returning to Step 3, the hydrogen radical treatment was carried out again to form the O—H groups on the surface of first layer nanocrystalline silicon structure. Then, silicon crystal grains were made grow at the respective nucleation sites of O—H group. Steps 3 through 9 are repeatedly carried out until the nanocrystalline silicon structure had a predetermined thickness.

The size of the silicon crystal grains could be controlled in nanometer scale by adjusting the substrate temperature. That is, when the substrate temperature was set at 540° C., the size of silicon nanocrystal grains obtained was about 2 nm. The size was about 10 nm when the substrate temperature was 550° C. Therefore, in order to control the size of silicon crystal grains for the practical use, the substrate temperature should be restricted within ±2° C. from a predetermined temperature.

The similar results were obtained when disilane gas was used instead of monosilane gas in Step 5. In order to obtain the crystal grains having the same size, the substrate temperature had to be set 5 degrees lower than in the case where monosilane gas was employed.

In addition, the similar results were also obtained even when nitrous oxide gas was used instead of oxygen gas in Step 9. In this case, it is not necessary to change the conditions of plasma and the like. In Step 9, the oxygen gas by itself was also able to terminate the surface of crystal grains, without causing plasma of oxygen gas; however, it took about 1 minute to completely form the bonds of oxide termination.

Figure 3:
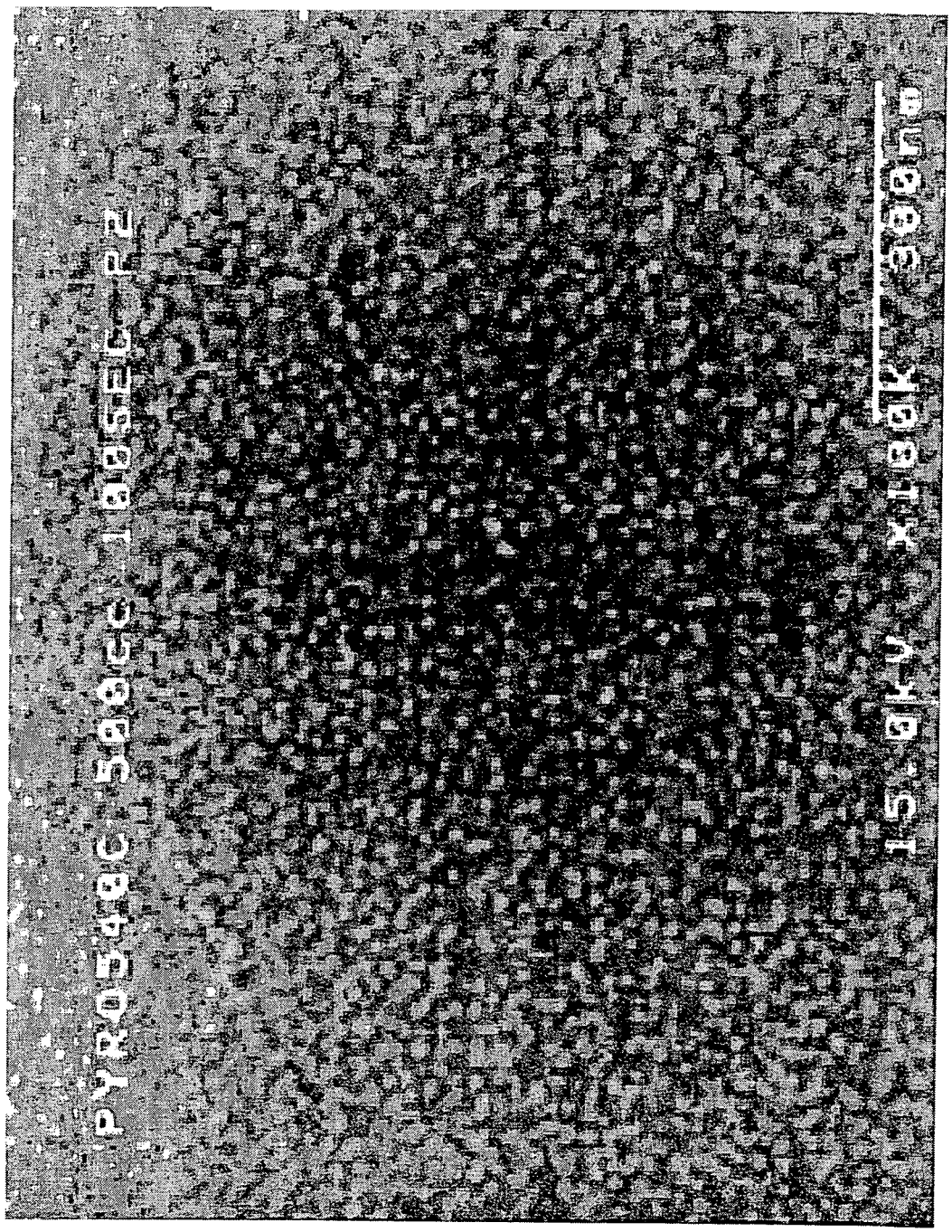
FIG. 3 is a high sensitive electron microscope image of a nanocrystalline silicon structure made according to one embodiment of the invention.

A high sensitive electron microscope image is shown in FIG. 3 of the oxygen terminated nanocrystalline silicon structure (one layer) thus prepared. As shown in FIG. 3, it was found that the silicon crystal grains having a uniform grain size of 7 nm are formed with high density in the nanocrystalline silicon structure.

Then, light emitting elements were fabricated using the nanocrystalline silicon structure (100 layers) prepared in the similar manner, and the luminescence efficiency was measured and compared with that fabricated using the conventional nanocrystalline silicon structure (porous silicon) prepared by the anodic oxidation. Here, a transparent conductive film (an ITO film) acting as a upper electrode as well as an antireflection film, was formed on the nanocrystalline silicon structure, and an ohmic electrode of Au was formed on the back surface of silicon substrate to fabricate the element.

As a result of the measurements, the light emitting element of this embodiment was found to have almost double luminescence efficiency as the conventional element using the porous silicon.

Although the nanocrystalline silicon structures terminated with oxygen have been mainly described so far, the nanocrystalline silicon structures terminated with nitrogen can be also prepared in a similar manner by treating the silicon nanocrystal grains using nitrogen radical instead of oxygen radical. The hydrogen radical treatment is made after the nitrogen radical treatment to form the N—H groups on the whole surface. The nanoscale silicon crystal grains grow at the nucleation sites of N—H group.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method of forming a nanocrystalline silicon structure with oxide or nitride termination, comprising:
    a first step of treating a surface of a substrate with hydrogen radicals;
    a second step of depositing silicon crystals having a grain size of 10 nm or less by the thermal reaction of a silicon-containing gas; and
    a third step of terminating the silicon crystals with oxygen or nitrogen by using at least one of oxygen gas, oxygen radical and nitrogen radical;
    wherein said oxygen radical and said nitrogen radical are generated by plasma decomposition reaction of oxygen ($O_2$) gas, nitrous oxide ($N_2O$) gas, or ammonia ($NH_3$) gas.

2. The method of forming a nanocrystalline silicon structure according to claim 1, wherein three steps of said first, second and third steps are repeatedly carried out until said structure has a predetermined thickness.

3. The method of forming a nanocrystalline silicon structure according to claim 1, wherein said hydrogen radical is generated by plasma decomposition reaction of hydrogen gas ($H_2$).

4. The method of forming a nanocrystalline silicon structure according to claim 1, wherein said silicon-containing gas is one of monosilane ($SiH_4$) gas, disilane ($Si_2H_6$) gas, and a mixed gas thereof with hydrogen gas ($H_2$).

5. The method of forming a nanocrystalline silicon structure according to claim 1, wherein said hydrogen radical is generated by plasma decomposition reaction of hydrogen gas ($H_2$).

6. A method of forming a nanocrystalline silicon structure with oxide or nitride termination, comprising:
    a first step of treating a surface of a substrate with hydrogen radicals;
    a second step of depositing silicon crystals having a grain size of 10 nm or less by the thermal reaction of a silicon-containing gas; and
    a third step of terminating the silicon crystals with oxygen or nitrogen by using at least one of oxygen gas, oxygen radical and nitrogen radical;
    wherein said first step, second step and third step are continuously carried out in one and the same vacuum chamber.

7. The method of forming a nanocrystalline silicon structure according to claim 6, wherein three steps of said first, second and third steps are repeatedly carried out until said structure has a predetermined thickness.

8. The method of forming a nanocrystalline silicon structure according to claim 6, wherein said silicon-containing gas is one of monosilane ($SiH_4$) gas, disilane ($Si_2H_6$) gas, and a mixed gas thereof with hydrogen gas ($H_2$).

* * * * *